United States Patent
Stockum et al.

(10) Patent No.: US 7,824,563 B2
(45) Date of Patent: Nov. 2, 2010

(54) ETCHING MEDIA FOR OXIDIC, TRANSPARENT, CONDUCTIVE LAYERS

(75) Inventors: Werner Stockum, Reinheim (DE); Armin Kuebelbeck, Bensheim (DE)

(73) Assignee: Merck Patent GmbH, Darmstadt (DE)

( * ) Notice: Subject to any disclaimer, the term of this patent is extended or adjusted under 35 U.S.C. 154(b) by 127 days.

(21) Appl. No.: 11/996,620

(22) PCT Filed: Jul. 3, 2006

(86) PCT No.: PCT/EP2006/006444
§ 371 (c)(1),
(2), (4) Date: Jan. 24, 2008

(87) PCT Pub. No.: WO2007/012378
PCT Pub. Date: Feb. 1, 2007

(65) Prior Publication Data
US 2008/0217576 A1    Sep. 11, 2008

(30) Foreign Application Priority Data
Jul. 25, 2005    (DE) ...................... 10 2005 035 255

(51) Int. Cl.
*C03C 25/68* (2006.01)
(52) U.S. Cl. ........................................................ 216/83
(58) Field of Classification Search ................ 252/79.2; 257/E21.002; 438/745, 758; 216/2, 83
See application file for complete search history.

(56) References Cited

U.S. PATENT DOCUMENTS

| | | | |
|---|---|---|---|
| 4,348,255 | A | 9/1982 | Schmidt et al. |
| 5,830,375 | A | 11/1998 | Huang et al. |
| 2003/0160026 | A1 | 8/2003 | Klein et al. |
| 2004/0242019 | A1 | 12/2004 | Klein et al. |

FOREIGN PATENT DOCUMENTS

| JP | 11-71135 | 3/1999 |
|---|---|---|
| JP | 2001-176864 | 6/2001 |
| SU | 1366489 A1 | 1/1988 |
| WO | WO 03/034504 A1 | 4/2003 |

OTHER PUBLICATIONS

Laserod—Laser Direct Write Pattern Generation by Ablation (1 page); Direct Laser Patterning Transparent Conductive Oxide (TCO) Coatings (2 pages); Copyright © 2005, Laserod.com, Inc. http://www.laserod.com/laser_direct_write.htm, downloaded Jul. 22, 2005.
Thesis of Dr. Shabbir A. Bashar, Ph.D., Chapter 5, Section 1, "Study of Indium Tin Oxide (ITO) for Novel Optoelectronic Devices,"—5. Indium Tin Oxide (ITO): Experiment and Results, 5.1 ITO Deposition—Results and Discussions—downloaded Jul. 22, 2005—11 pages.
Thesis of Dr. Shabbir A. Bashar, Ph.D., Chapter 5, Section 2, "Study of Indium Tin Oxide (ITO) for Novel Optoelectronic Devices,"—5.2 Patterning ITO—downloaded Jul. 22, 2005—7 pages.
Thesis of Dr. Shabbir A. Bashar, Ph.D., Chapter 5, Section 3, "Study of Indium Tin Oxide (ITO) for Novel Optoelectronic Devices,"—5.3 Post Deposition Treatments—downloaded Jul. 22, 2005—4 pages.
Thesis of Dr. Shabbir A. Bashar, Ph.D., Chapter 5, Section 4, "Study of Indium Tin Oxide (ITO) for Novel Optoelectronic Devices,"—5.4 Ohmic Contacts to ITO—downloaded Jul. 22, 2005—3 pages.
Mitsui Chemicals, Annual Report 2001—Year End Mar. 31, 2001. "Acting Now, Growing Stronger," 60 pages.

*Primary Examiner*—Binh X Tran
*Assistant Examiner*—Patti Lin
(74) *Attorney, Agent, or Firm*—Millen, White, Zelano & Branigan, P.C.

(57) ABSTRACT

The present invention relates to a novel etching medium for the structuring of transparent, conductive layers, as are used, for example, in the production of liquid-crystal displays (LCDS) using flat-panel screens or of organic light-emitting displays (OLEDs) or in thin-film solar cells. Specifically, it relates to particle-free compositions by means of which fine structures can be etched selectively in oxidic, transparent and conductive layers without damaging or attacking adjacent areas. The novel liquid etching medium can advantageously be applied by means of printing processes to the oxidic, transparent, conductive layers to be structured. Subsequent heat treatment accelerates or initiates the etching process.

15 Claims, No Drawings

ETCHING MEDIA FOR OXIDIC, TRANSPARENT, CONDUCTIVE LAYERS

The present invention relates to a novel etching medium for the structuring of transparent, conductive layers, as are used, for example, in the production of liquid-crystal displays (LCDs) using flat-panel screens or of organic light-emitting displays (OLEDs) or in thin-film solar cells. Specifically, it relates to particle-free compositions by means of which fine structures can be etched selectively in oxidic, transparent and conductive layers without damaging or attacking adjacent areas. The novel liquid etching medium can advantageously be applied by means of printing processes to the oxidic, transparent, conductive layers to be structured. Subsequent heat treatment accelerates or initiates the etching process.

PRIOR ART

It is necessary to structure oxidic, transparent, conductive layers on a support material, such as, for example, on thin glass, for the production of liquid-crystal displays. An LC display essentially consists of two glass plates provided with oxidic, transparent, conductive layers, usually of indium-tin oxide (ITO), which change their light transparency through application of a voltage. A liquid-crystal layer is located in between. The use of spacers prevents contact of the ITO front and back. For the display of characters, symbols or other patterns, it is necessary to structure the ITO layer on the glass sheet. This enables areas within the display to be addressed selectively.

Oxidic, transparent, conductive layers thus play an outstanding role in the process for the production of flat-panel screens and of thin-film solar cells. In flat-panel screens based on liquid-crystal displays or organic light-emitting diodes, at least the electrode facing the viewer has to have the highest possible transparency in order to be able to make the optical effect visible to the viewer. The optical effect may, as in the case of liquid-crystal displays, be a change in the transmission or reflection or, as in the case of OLEDs, represent an emission of light.

In thin-film solar cells based on amorphous silicon (a-Si), copper-indium selenide (CIS) or cadmium telluride, the side of the solar cell facing the sun likewise consists of an oxidic, transparent, conductive material. This is necessary since the semiconducting layers have inadequate electrical conductivity to enable economical transport of charge carriers.

Oxidic, transparent, conductive layers which are known to the person skilled in the art are:
indium-tin oxide $In_2O_3$:Sn (ITO)
fluorine-doped tin oxide $SnO_2$:F (FTO)
antimony-doped tin oxide $SnO_2$:Sb (ATO)
aluminium-doped zinc oxide ZnO:Al (AZO)
In addition, the literature describes, for example, the systems
cadmium stannate $CdSnO_3$ (CTO)
indium-doped zinc oxide ZnO:In (IZO)
undoped tin(IV) oxide (TO)
undoped indium(III) oxide (IO)
undoped zinc oxide (ZO).

In display and thin-film solar technology, essentially indium-tin oxide (ITO) has established itself as transparent, conductive material. This is due, inter alia, to the very low layer resistances of <6Ω in the case of layer thicknesses of 200 nm and transmission values of >80% that can be achieved therewith. However, it is also due to the mature and relatively simple coating by means of cathode sputtering.

A good review of oxidic, transparent, conductive layers and their deposition techniques is offered by K. L. Chopra, S. Major and D. K. Pandya in "Transparent Conductors—A Status Review", Thin Solid Films, 102 (1983) 1-46, Electronics and Optics.

The oxidic, transparent, conductive layers are usually deposited over the entire area of the support material. The support material used in most cases is flat glass (soda-lime glasses, borosilicate glasses or similar glasses drawn by machine or produced by the float glass process). Other suitable support materials are polycarbonate (PC), polyethylene terephthalate (PET) and similar transparent polymers.

Essentially the following deposition methods are used here:
direct vapour deposition of the oxides
reactive vapour deposition of the metals in the presence of oxygen
direct cathode sputtering of the oxides (DC, magnetron, RF or ionbeam sputtering)
reactive sputtering of the metals in the presence of oxygen
chemical vapour deposition (CVD) of precursors, such as, for example, $SnCl_4$
spray pyrolysis
dip coating with a suitable sol In the two most important applications of transparently conductive layers (flat-panel screens and thin-film solar cells), the transparently conductive layer is structured. In the case of flat-panel screens, individual pixels or segments can be addressed. In the case of thin-film solar cells, serial switching of a plurality of separate solar cells within a substrate is achieved. This results in a higher initial voltage, which is in turn advantageous owing to the better overcoming of ohmic resistances.

A number of different structuring methods are usually employed for the production thereof.

The following, inter alia, may be mentioned:

Mask Vapour Deposition or Mask Sputtering

For the production of relatively simple structures, it is sufficient for the transparent, conductive layer to be coated through an applied mask. Sputtering with the aid of an applied mask is a process known to the person skilled in the art. U.S. Pat. No. 4,587,041 A1 describes a process of this type.

Mask vapour deposition or mask sputtering is a fairly simple process. However, the process is not suitable for mass production, especially for the production of relatively large substrates. The masks warp in the process owing to different coefficients of expansion of substrate and mask. In addition, the masks can only be used for a few coating steps since material is constantly deposited on them. In addition, relatively complex structures, such as, for example, hole structures, cannot be produced using an applied mask. Furthermore, the resolution in respect of the formation of extremely fine lines and structures is very limited in this process. Mask sputtering has therefore only been able to establish itself for small series with short runs.

Laser Ablation

With the aid of laser light in the near infrared region (NIR), as emitted, for example, by an Nd:YAG laser, it is possible to structure transparently conductive layers. The method is described, for example, on the Laserod.com, Inc., web page Disadvantages in this method are the relatively high equipment complexity, the low throughput in the case of relatively complex structures and the re-deposition of evaporated material onto adjacent areas. Laser ablation is essentially only employed in the area of thin-film solar cells, for example for cadmium-tellurium solar cells.

An example of laser ablation on transparent, conductive layers has been described (C. Molpeceres et al 2005 J. Micromech. Microeng. 15 1271-1278).

Photolithography

The use of etchants, i.e. chemically aggressive compounds, causes dissolution of the material exposed to the attack by the etchant. In most cases, the aim is completely to remove the layer to be etched, The end of the etching is achieved by the encountering of a layer which is substantially resistant to the etchant.

The production of a negative or positive of the etch structure (depending on the photoresist) is usually carried out in the following steps:
- coating of the substrate surface (for example by spin coating with a liquid photoresist),
- drying of the photoresist,
- exposure of the coated substrate surface,
- development,
- rinsing,
- if necessary drying,
- etching of the structures, for example by
    - dip processes (for example wet etching in wet-chemistry benches)
    - dipping of the substrates into the etching bath, etching process
    - spin-on or spray processes: the etching solution is applied to a rotating substrate, the etching process can be carried out without/with input of energy (for example IR or UV irradiation)
    - dry-etching processes, such as, for example, plasma etching in complex vacuum units or etching with reactive gases in flow reactors,
- removal of the photoresist, for example by means of solvents,
- rinsing,
- drying Owing to the high structure accuracy of the etched areas—the etched structures can be etched accurately down to a few μm—and the fairly high throughput, even in the case of highly complex structures to be etched, photolithography is the method of choice for the structuring of oxidic, transparent, conductive layers in the area of flat-panel screens However, it is particularly disadvantageous that a large number of proc ess steps is necessary with use of very expensive equipment. In addition, considerable amounts of auxiliary chemicals (photoresist, developer, etching medium, resist stripper) and rinsing water are consumed.

Liquid etching media described in the literature, especially for the fully oxidised indium-tin oxide (ITO) widely used in the area of flat-panel screens, are:
- iron(III) chloride+hydrochloric acid
- hot, approximately 30% by weight hydrochloric acid
- hot, 48% by weight hydrobromic acid
- aqua regia (in some cases dilute).

Etching in the gas phase, optionally in a plasma, of ITO is also known, but currently only plays a minor role. Use is made here, for example, of hydrogen bromide gas or hydrogen iodide gas. Corresponding methods are described on the Mitsui Chemical web page.

A common feature of all the said fluid etching media is that they are extremely corrosive systems. The etching media can be classified as fairly problematic for the surrounding equipment, the operating personnel and the environment.

The structuring of oxidic, transparent, conductive materials, in particular the production of flat-panel screens, is therefore usually carried out using, as known process, the complex and material-intensive process of photolithography, since the existing alternatives (laser ablation and mask sputtering) are not sufficiently capable.

OBJECT

The object of the present invention is therefore to provide novel, inexpensive etching pastes for the etching of very uniform, thin lines having a width of less than 500 μm, in particular less than 100 μm, and of extremely fine structures on doped tin-oxide layers which are used for the production of LC displays. The doped tin-oxide layers are transparent, conductive layers, as are used, for example, in the production of liquid-crystal displays (LCDs) using flat-panel screens or of organic light-emitting displays (OLEDs) or in thin-film solar cells. A further object of the present invention is to provide novel etching media which, after the etching, can be removed from the treated surfaces in a simple manner under the action of heat without leaving residues.

DESCRIPTION OF THE INVENTION

The present invention provides etching media for the etching of oxidic, transparent, conductive layers, comprising an at least one etchant consisting of
- phosphoric acid or salts thereof or
- adducts of phosphoric acid or
- mixtures of phosphoric acid with salts of phosphoric acid and/or adducts of phosphoric acids. Experiments have shown that the etching media according to the invention are particularly suitable for the etching of doped tin-oxide layers.

Etching media according to the invention comprise, as active, etching component, at least one acid selected from the group of ortho-, meta-, pyro-, oligo- and polyphosphoric acid and/or meta-phosphorus pentoxide, or mixtures thereof. However, it is also possible for one or more different ammonium salt(s) of phosphoric acid and/or mono- or di- or tri-esters of a phosphoric acid which liberate the etching phosphoric acid through thermal input of energy to be present.

The present invention also relates to corresponding etching media in paste form which, in addition to at least one etchant, comprise solvents, particulate and/or soluble inorganic and/or organic thickeners and optionally additives, such as antifoams, thixotropic agents, flow-control agents, deaerators and adhesion promoters.

The present invention likewise relates to a process for the etching of oxidic, transparent, conductive layers, in particular of corresponding doped tin-oxide layers. Depending on the consistency of the etching medium according to the invention that is used and depending on the application, the etching medium is applied by spraying, spin coating, dipping or by printing by screen, stencil, stamp, pad or ink-jet printing.

In order to carry out the process, corresponding etching media are preferably applied by means of a printing process to the substrate to be etched. The etching medium applied can usually be activated by warming. Depending on the composition of the etching medium and etchant employed, heating to different temperatures must be carried out for this purpose. The heating can accordingly be carried out in different ways, for example on a hotplate, in a convection oven, by IR radiation, visible light, UV radiation or with the aid of microwaves.

The process according to the invention can be used for the structuring of oxidic, transparent, conductive layers for the production of solar cells.

However, it is also possible for oxidic, transparent, conductive layers to be structured in a corresponding manner for the production of flat-panel screens.

DETAILED DESCRIPTION OF THE INVENTION

WO 03/040345 describes a combined etching and doping medium for etching silicon nitride. The etchant present is based on phosphoric acid, or salts thereof and/or corresponding precursors. As experiments have shown, only silicon nitride layers can be treated at adequate etching rates under the conditions described in this patent application.

Surprisingly, experiments have now shown that oxidic, transparent, conductive layers, such as, in particular, indium-tin oxide, can also be etched at high etching rates under suitable conditions at moderate temperatures using corresponding etching media in which the etchant is based on a phosphoric acid, or salts thereof and/or corresponding precursors.

The etchant used in the etching media according to the invention is phosphoric acid, or salts thereof or suitable precursors from which a phosphoric acid is liberated under suitable application conditions.

For the purposes of the present invention, the term phosphoric acid is specifically taken to mean the following phosphoric acids:
ortho-phosphoric acid ($H_3PO_4$),
pyro-phosphoric acid ($H_4PO_7$),
meta-phosphoric acid [$(HPO_3)_x$],
oligo- and polyphosphoric acids,
phosphonic acid (phosphorous acid),
phosphinic acid (hypophosphorous acid),
phenylphosphinic acid and other organic phosphinic acids,
phenylphosphonic acid and other organic phosphonic acids.

Salts of phosphoric acid which can be employed the mono-, di- and trisalts of the acids mentioned under phosphoric acids. In particular, these are taken to mean the corresponding ammonium salts. The corresponding phosphoric acids are liberated from these salts in the formulations of the etching media, if necessary by heating.

The term phosphoric acid precursors is taken to mean compounds which form phosphoric acids and/or salts thereof by chemical reaction and/or thermal decomposition. For use in the etching media according to the invention, corresponding mono-, di- or triesters of the said phosphoric acids, such as, for example, monomethyl phosphate, di-n-butyl phosphate (DBP) and tri-n-butyl phosphate (TBP), are particularly suitable.

Phosphoric acids are per se Lewis acids which are capable of forming adducts with Lewis bases. These phosphoric acid adducts may decompose back into the starting materials at elevated temperatures. More volatile or decomposing Lewis bases liberate the phosphoric acids in the process.

An example of a suitable Lewis base is 1-methyl-2-pyrrolidone (NMP), which is also used in compositions according to the invention reproduced by way of example.

Phosphoric acid-based etching media have considerable advantages over the known etching media outlined above for the etching of ITO:
The etching medium in the form of a thickened paste can be applied selectively by means of a printing process to the substrate to be etched. Complex photolithography can be omitted.
Due to the very low volatility of the etching medium, which takes on a glass-like state during the etching process ("phosphorus salt beads"), the etching rate, even of extremely small amounts of printed-on etching medium, is constantly high over an extended period. Aqueous etching media or those based on other solvents lose their etching power virtually completely within a few minutes due to evaporation of the solvent or etching medium.

The etching can be initiated by input of heat. At room temperature, the etching rate is very low (<1 nm/min).

At 180° C., the etching rate in fully oxidised indium-tin oxide is about 100 nm/min. By contrast, the etching rate of indium-tin oxide in 18% by weight hydrochloric acid is only 8 Å/s (=48 nm/min), as described on the betelco web page.

The etching medium has a very low vapour pressure. It is consequently not corrosive to the environment. Thus, for example, metallic components, such as print heads, print screens, etc., which are in direct contact with the etching medium can be used without problems.

In print trials with high-resolution screen-printing fabrics, etch line widths of 50 μm were achieved. Significantly smaller line widths are virtually impossible to produce by screen printing, essentially due to the available screen-printing fabrics. For many applications, for example standard TNLCDs (7-segment displays and the like), however, this resolution is entirely adequate. For higher-quality displays, for example STN matrix displays or TFT matrix displays, higher resolutions are necessary.

In order to be able to produce higher resolutions, or finer printed structures, other printing processes are necessary. The classical printing processes, such as, for example, offset printing, pad printing and the like, either cannot be employed on the substrates used, such as, for example, thin glass sheets, or the desired resolution cannot be achieved with their aid.

A usable printing process is ink-jet printing. For example, Litrex (Peasanton, Calif., USA) manufactures high-resolution industrial ink-jet printers. The Litrex 120 ink-jet printer enables individual etching-media droplets having a volume of 10 picolitres to be applied without contact to an ITO-coated glass substrate with a positioning accuracy of ±10 μm. The equipment thus enables line widths of down to 30 μm to be etched into ITO on use of the etching media according to the invention.

For better understanding and in order to illustrate the invention, examples are given below which are within the scope of protection of the pre-sent invention. These examples also serve to illustrate possible variants. Owing to the general validity of the inventive principle described, however, the examples are not suitable for reducing the scope of protection of the present application to these examples alone.

EXAMPLES

Example 1

Preparation of an Etching Paste for Indium-Tin Oxide 446 g of phosphoric acid (85%)
are added with stirring to a solvent mixture consisting of
176 g of deionised water and
271 g of 1-methyl-2-pyrrolidone.
15 g of hydroxyethylcellulose
are subsequently added with vigorous stirring.
293 g of Vestosint polyamide powder
are then added to the clear, homogeneous mixture, which is stirred for a further 2 hours.

The paste, which is now ready to use, can be printed using a 260 mesh stainless-steel fabric screen. In principle, polyester or similar screen materials can also be used.

Example 2

460 g of phosphoric acid (85%)
are added with stirring to a solvent mixture consisting of 181 g of deionised water,
181 g of ethylene glycol and
98 g of 1-methyl-2-pyrrolidone.
17 g of hydroxyethylcellulose
are subsequently added with vigorous stirring.
293 g of Coathylene polyethylene powder
are then added to the clear, homogeneous mixture, which is stirred for a further 2 hours.

The paste, which is now ready to use, can be printed using a 260 mesh stainless-steel fabric screen. In principle, polyester or similar screen materials can also be used.

Example 3

446 g of phosphoric acid (85%)
are added with stirring to a solvent mixture consisting of
176 g of deionised water and
271 g of 1-methyl-2-pyrrolidone.
32 g of polyethylene glycol 1500 and
15 g of hydroxyethylcellulose
are subsequently added with vigorous stirring.
271 g of magnesium sulfate powder
are then added to the clear, homogeneous mixture, which is stirred for a further 2 hours.

The paste, which is now ready to use, can be printed using a 260 mesh stainless-steel fabric screen. In principle, polyester or similar screen materials can also be used.

High-Resolution Screen Printing on an ITO-Coated Substrate

For a print and etch test, the following parameters were used:

| Screen: | steel screen having a mesh count of 260 mesh/inch and filament diameter of 20 μm and emulsion thickness of 15 μm. |
|---|---|
| Layout: | 45 μm lines |
| Screen printing machine: | EKRA E1 |
| Substrate: | glass with 125 nm ITO layer |
| Etching: | heated at 180° C. for 120 s |

Result: the etched line had a width of on average 50 μm.

Ink-Jet Printing on an Ito-Coated Substrate

| Ink-jet printer: | OTB |
|---|---|
| Print head: | XAAR Omnidot 760 |
| Viscosity of etching medium: | 7-10 mPas (with optimised etching paste) |
| Maximum frequency: | 5.5 kHz |
| Maximum linear speed: | 700 mm/s |
| Pixel resolution: | 1440 dpi |
| Distance of print head: | 1 mm |
| Substrate: | glass with 125 nm ITO layer |
| Etching: | heated at 180° C. for 120 s |

Result: the etched line had a width of <35 μm.

The invention claimed is:

1. A process for the selective etching of an oxidic, transparent, conductive layer in a solar cell, flat-panel screen, liquid crystal display or organic light-emitting display to a line width of less than 100 μm,
comprising applying an etchant paste comprising
 a) water,
 b) a particulate and/or soluble inorganic and/or organic thickener and
 c) phosphoric acid or a salt thereof, an adduct of phosphoric acid or a mixture of phosphoric acid with a salt of phosphoric acid and/or an adduct of phosphoric acid,
to said oxidic, transparent, conductive layer by spraying, spin coating, dipping, screen, stencil, stamp, pad or ink-jet printing and
then heating said oxidic, transparent, conductive layer.

2. A process according to claim 1 wherein said etchant paste further comprises, solvents, and optionally additives, such as antifoams, thixotropic agents, flow-control agents, deaerators and adhesion promoters.

3. A process according to claim 1, wherein said etchant medium comprises as active component, ortho-, meta-, pyro-, oligo- and/or polyphosphoric acid and/or meta-phosphorus pentoxide, or mixtures thereof.

4. A process according to claim 3, wherein said etchant medium comprises one or more different ammonium salt(s) of phosphoric acid and/or mono- or di- or triesters of a phosphoric acid which liberate the etching phosphoric acid through thermal input of energy.

5. A process according to claim 1, wherein said line width is less than 50 μm.

6. A process according to claim 5, wherein said line width is less than 35 μm.

7. A process according to claim 1, for the etching of oxidic, transparent, conductive layers, wherein said etchant paste is applied by means of a printing process to the substrate to be etched.

8. A process according to claim 7, wherein said etchant paste is applied, by screen, stencil, stamp, pad or ink-jet printing.

9. A process according to claim 7, wherein the heating is carried out on a hotplate, in a convection oven, by IR radiation, visible light, UV radiation or microwaves.

10. A process according to claim 7 for the structuring of oxidic, transparent, conductive layers for the production of solar cells.

11. A process according to claim 7 for the structuring of oxidic, transparent, conductive layers for the production of flat-panel screens.

12. A process for the selective etching of an oxidic, transparent, conductive layer in a solar cell, flat-panel screen, liquid crystal display or organic light-emitting display
to a line width of less than 50 μm,
comprising applying an etchant paste comprising
 phosphoric acid or a salt thereof,
 an adduct of phosphoric acid or
 a mixture of phosphoric acid with a salt of phosphoric acid and/or an adduct of phosphoric acid
to said oxidic, transparent, conductive layer by spraying, spin coating, dipping, screen, stencil, stamp, pad or ink-jet printing and
then heating said oxidic, transparent, conductive layer to about 180° C.

13. A process according to claim 12, wherein said line width is less than 35 μm.

14. A process according to claim 12, wherein said etchant paste further comprises:
 water,
 methyl-pyrrolidone and
 hydroxyethylcellulose.

15. A process according to claim 12, wherein said etchant paste is applied by ink-jet printing.

* * * * *